United States Patent
Ren et al.

(10) Patent No.: US 11,411,587 B2
(45) Date of Patent: Aug. 9, 2022

(54) SIGNAL PROCESSING METHOD AND SYSTEM

(71) Applicant: Huawei Technologies Co., Ltd., Shenzhen (CN)

(72) Inventors: Zhixiong Ren, Wuhan (CN); Xiaoshu Si, Wuhan (CN); Tao Ouyang, Wuhan (CN); Pere L Gilabert, Barcelona (ES); Jose Angel Garcia Garcia, Santander (ES); Gabriel Montoro, Barcelona (ES)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/193,212

(22) Filed: Mar. 5, 2021

(65) Prior Publication Data

US 2021/0218427 A1 Jul. 15, 2021

Related U.S. Application Data

(63) Continuation of application No. PCT/CN2018/104648, filed on Sep. 7, 2018.

(51) Int. Cl.
*H04B 1/04* (2006.01)
*H03F 1/32* (2006.01)
(Continued)

(52) U.S. Cl.
CPC ............ *H04B 1/04* (2013.01); *H03F 1/3241* (2013.01); *H03F 1/42* (2013.01); *H03F 3/245* (2013.01);
(Continued)

(58) Field of Classification Search
CPC . H04B 1/04; H03F 1/3241; H03F 1/42; H03F 3/245; H03F 2200/102; H03F 2200/36
(Continued)

(56) References Cited

U.S. PATENT DOCUMENTS

| 5,929,710 A | 7/1999 | Bien |
| 2001/0033667 A1 | 10/2001 | Behringer et al. |

(Continued)

FOREIGN PATENT DOCUMENTS

| CN | 101110595 A | 1/2008 |
| CN | 101651459 A | 2/2010 |

(Continued)

OTHER PUBLICATIONS

Zhang, Y., et al., "Signal Component Separator Implement Method Based on LINC Transmitter," Modem Electronics Technique, 2008, Issue 23, 3 pages.

(Continued)

*Primary Examiner* — Kevin M Burd
(74) *Attorney, Agent, or Firm* — Conley Rose, P.C.

(57) ABSTRACT

A signal processing method and system includes a baseband signal baseband signal processing module configured to perform slow envelope processing on a first signal, to obtain an envelope value E(n) of the first signal on which the slow envelope processing has been performed, obtain a phase value θ(n) based on E(n), where θ(n) and E(n) are in a linear relationship, and separate the first signal into a second signal and a third signal based on θ(n), where a phase difference between the second signal and the third signal is 2 θ(n), an amplifier configured to amplify the second signal and the third signal, and a synthesizer is configured to combine the amplified second signal and third signal to obtain a fourth signal.

20 Claims, 8 Drawing Sheets

(51) Int. Cl.
*H03F 1/42* (2006.01)
*H03F 3/24* (2006.01)

(52) U.S. Cl.
CPC .... *H03F 2200/102* (2013.01); *H03F 2200/36* (2013.01)

(58) Field of Classification Search
USPC .................................................. 375/295, 297
See application file for complete search history.

(56) References Cited

U.S. PATENT DOCUMENTS

| | | | |
|---|---|---|---|
| 2007/0082628 | A1 | 4/2007 | Sorrells et al. |
| 2008/0019456 | A1* | 1/2008 | Chen ..................... H03F 1/0294 375/264 |
| 2008/0285681 | A1* | 11/2008 | Sorrells ................ H03G 3/3042 375/297 |
| 2013/0147549 | A1 | 6/2013 | Maniwa et al. |
| 2014/0118063 | A1 | 5/2014 | Briffa et al. |
| 2014/0266464 | A1* | 9/2014 | Ma ........................... H03F 3/24 330/295 |
| 2018/0175800 | A1 | 6/2018 | Hayes et al. |
| 2020/0295790 | A1* | 9/2020 | Langer ................. H04B 1/0475 |

FOREIGN PATENT DOCUMENTS

| | | | |
|---|---|---|---|
| CN | 103166578 | A | 6/2013 |
| CN | 104283573 | A | 1/2015 |
| CN | 108206675 | A | 6/2018 |
| CN | 108336975 | A | 7/2018 |
| DE | 10015833 | A1 | 10/2001 |
| EP | 3736977 | A1 | 11/2002 |
| JP | H0974320 | A | 3/1997 |
| WO | 2012023624 | A1 | 2/2012 |
| WO | WO-2019134702 | A1 * | 7/2019 ............. H03F 3/189 |

OTHER PUBLICATIONS

Tajima, Y., et al., "Improved Efficiency in Outphasing Power Amplifier by Mixing Outphasing and Amplitude Modulation," 2017 IEEE Topical Conference on RF/Microwave Power Amplifiers for Radio and Wireless Applications (PAWR), 4 pages.

Chen, J., et al., "An Efficiency-Improved Outphasing Power Amplifier Using RF Pulse Modulation," IEEE Microwave and Wireless Components Letters (vol. 20, Issue: 12, Dec. 2010), 3 pages.

Deng Xiangke, "Research on Outphasing Transmitter Based on Class F Power Amplifier," University of Electronic Science and Technology, 2011, Issue 03, 2 pages (abstract).

* cited by examiner

--Prior Art--

SIGNAL PROCESSING METHOD AND SYSTEM

CROSS-REFERENCE TO RELATED APPLICATIONS

This application is a continuation of International Patent Application No. PCT/CN2018/104648 filed on Sep. 7, 2018, which is hereby incorporated by reference in its entirety.

TECHNICAL FIELD

Embodiments of this application relate to the communications field, and in particular, to a signal processing method and system.

BACKGROUND

With the rapid development of wireless communications technologies, a power amplifier (PA) operates at a frequency from an ultra-low frequency to a millimeter wave, and with an output power from 10 milliwatts in a short-distance application to 1 megawatt in a long-distance transmission. An amplified signal includes almost all possible modulation schemes. At the same time, the power amplifier appears in a growing number of application scenarios, such as communications, radar, broadcasting, missile guidance, navigation, and laser drive.

The initial research on the power amplifier is mainly limited to application scenarios of relatively low spectrums, such as audio signal amplification. However, with the further development of wireless technologies, especially the popularization of mobile communications systems, new requirements are put forward on the performance of the power amplifier. First, because the signal bandwidth is continuously expanding and the channel capacity is bottlenecked, a modern wireless communications system usually uses very complex signal modulation schemes (such as orthogonal frequency division multiplexing (OFDM) and quadrature amplitude modulation (QAM)) to increase band utilization. A signal in such modulation schemes has a very high peak-to-average ratio (PAR). Therefore, an extremely high linearity is required for the power amplifier. Second, with the miniaturization of electronic devices and the improvement of energy-saving performance, the system also put forward higher requirements on efficiency of the power amplifier.

Therefore, for the two main characteristics, namely, the high bandwidth and the high PAR, of the signal in the current communications system, to achieve lossless transmission of the signal, functional modules in a communications link need to satisfy requirements such as a high bandwidth and a high linearity.

The power amplifier serves as a core function module in a communications link, and expansion of the signal bandwidth requires a higher linearity of the power amplifier. As the PAR increases, the power amplifier backs off to a lower-efficiency region, causing a system energy loss and a temperature rise. Therefore, a complex heat dissipation system design needs to be added. Therefore, how to make the power amplifier satisfy the requirements such as a high bandwidth and a high PAR and ensure the efficiency becomes an urgent problem to be resolved.

Mainstream efficiency improvement technologies may be classified into load modulation and bias modulation, where the load modulation technology further includes an outphasing power amplification (outphasing) technology. In the outphasing technology of the conventional technologies, two channels of signals obtained after $S_{in}=A(t)\times\cos(\omega t+\varphi(t))$ (where $A(t)$ is an amplitude value of $S_{in}$, and $\varphi(t)$ is a phase value) is split are respectively $S_1(t)=A_0\times\cos(\omega t+\varphi(t)+\theta(t))$ and $S_2(t)=A_0\times\cos(\omega t+\varphi(t)-\theta(t))$, where $\theta(t)=\arccos(0.5\times A(t)/A_0)$.

In the conventional outphasing technology, during signal separation, an amplitude value $A(t)$ in an amplitude and phase modulation input signal is converted into a phase value $\theta(t)$. In a process of converting an amplitude value into a phase value, due to introduction of a nonlinear factor $\theta(t)=\arccos(0.5\times A(t)/A_0)$, the process of converting $A(t)$ into $\theta(t)$ is a nonlinear operation, making the two channels of separated constant envelope signals: $S_1(t)$ and $S_2(t)$, have a bandwidth expansion effect. Correspondingly, a bandwidth requirement on the amplifier needs to be increased. A person skilled in the art may learn that the amplifier sacrifices gains and efficiency in a case of increasing the bandwidth. The bandwidth expansion affects the overall performance of an outphasing system.

To resolve the foregoing problem, the other approaches provides a hybrid-mode outphasing technology, which is as follows. When an output power of a signal is high, the value of $\theta(t)$ is still $\arccos(0.5\times A(t)/A_0)$, and when the output power of the signal is low, $\theta(t)$ may be a specified value $\theta_{th}$. In other words, amplitudes of some signals (high-power signals) in amplitude and phase modulation signals are converted into phases, and phase values of the other signals (low-power signals) are constantly $\theta_{th}$, to reduce the overall bandwidth expansion effect of the signals to three to five times.

The hybrid-mode outphasing technology reduces the overall bandwidth expansion effect of the signals to three to five times. However, in a large-bandwidth scenario, for example, in an application scenario such as 5th generation mobile communication system (5G), the bandwidth is usually greater than 200 megahertz (MHz). In other words, when the bandwidth expansion effect is three to five times, the 200 MHz signal bandwidth is expanded to at least 600 MHz, and the bandwidth requirement for the amplifier is still excessively high. The amplifier in the hybrid-mode outphasing technology still cannot satisfy a bandwidth requirement of a large-bandwidth signal on which bandwidth expansion has been performed.

SUMMARY

This application provides a signal processing method and system, to avoid, to some extent, a problem of system performance degradation caused by a signal expansion effect.

To achieve the foregoing objective, this application uses the following technical solutions.

According to a first aspect, an embodiment of this application provides a signal processing system, where the system includes a baseband signal processing module, an amplifier, and a synthesizer. The baseband signal processing module may perform slow envelope processing on a first signal, to obtain an envelope value $E(n)$ of the first signal on which the slow envelope processing has been performed; and obtain a phase value $\theta(n)$ based on the envelope value $E(n)$, where $\theta(n)$ and $E(n)$ are in a linear relationship. Then, the baseband signal processing module may separate the first signal into a second signal and a third signal based on the obtained $\theta(n)$, where a phase difference between the second signal and the third signal is $2\theta(n)$.

In the foregoing manner, E(n) that may be in a linear relationship with θ(n) represents θ(n), so that the overall bandwidth expansion of the signal is reduced to one to two times, thereby improving the overall performance of the system.

In a possible implementation, before performing the slow envelope processing on the first signal, the baseband signal processing module may be further configured to obtain a digital predistortion coefficient based on a fourth signal output by the synthesizer; substitute the digital predistortion coefficient into a digital predistortion model to obtain a digital predistortion output signal, and perform digital predistortion processing on a fifth signal based on the digital predistortion output signal. The digital predistortion model includes a digital predistortion factor $K(n-\tau_m^C)$, where n is a discrete time, $\tau_m^C$ is a memory depth, and a nonlinear distortion characteristic of the digital predistortion output signal is opposite to a nonlinear distortion characteristic of the fourth signal. Correspondingly, the baseband signal processing module is further configured to perform slow envelope processing on the fifth signal, and separate the fifth signal on which the slow envelope processing has been performed into two channels of signals; the amplifier is further configured to amplify the two channels of signals; and the synthesizer is further configured to combine the two channels of amplified signals, to output a sixth signal.

In the foregoing manner, digital predistortion processing is implemented on the first signal, thereby improving linearity of the output signal obtained after the processing such as slow envelope, amplification, and combination has been performed.

In a possible implementation, the baseband signal processing module may be configured to obtain θ(n) based on the envelope value E(n) by using a formula $$\theta(n) = \left(1 - \frac{E(n)}{\max(E(n))}\right) \cdot \varphi_0,$$

where $\varphi_0$ is a preset value.

In the foregoing manner, the envelope value E(n) after the slow envelope processing is used to represent the phase value θ(n), and a linear relationship is enabled between E(n) and θ(n), thereby reducing the impact of the bandwidth expansion on the system performance.

In a possible implementation, the baseband signal processing module may be configured to, when the envelope value E(n) is less than a preset threshold, θ(n) is a specified value.

In the foregoing manner, the signal whose envelope value E(n) is less than the preset threshold, that is, whose output power is low, is processed, so that the phase difference between the two channels of signals obtained after the low-power signal is separated is constant, thereby further reducing a bandwidth expansion effect and improving an overall performance value of the system.

In a possible implementation, the amplifier may further include an output matching circuit. The output matching circuit may be configured to perform impedance matching on the second signal and the third signal separately. A first impedance value after the impedance matching is close to an impedance value corresponding to a maximum power output value of an amplifier power tube, and a second impedance value after the impedance matching is close to an impedance value corresponding to a maximum efficiency output value of the amplifier power tube. The first impedance value is an impedance value corresponding to a first intersection point between an impedance value curve of the second signal and an impedance value curve of the third signal, and the second impedance value is an impedance value corresponding to a second intersection point between the impedance value curve of the second signal and the impedance value curve of the third signal.

In the foregoing manner, active load modulation processing is implemented on the signal on which the slow envelope processing has been performed, and impedance matching is adjusted based on the maximum power output value and the maximum efficiency output value, so that average efficiency of the amplifier may be improved.

According to a second aspect, an embodiment of this application provides a signal processing method, where the method includes performing slow envelope processing on a first signal, to obtain an envelope value E(n) of the first signal on which the slow envelope processing has been performed; obtaining a phase value θ(n) based on the envelope value E(n), where θ(n) and E(n) are in a linear relationship; separating the first signal into a second signal and a third signal based on θ(n), where a phase difference between the second signal and the third signal is 2 θ(n); amplifying the second signal and the third signal; and combining the amplified second signal and third signal to obtain a fourth signal.

In a possible implementation, before the step of performing slow envelope processing on a first signal, the method further includes obtaining a digital predistortion coefficient based on a previous fourth signal; and substituting the digital predistortion coefficient into a digital predistortion model to obtain a digital predistortion output signal, and performing digital predistortion processing on a fifth signal based on the digital predistortion output signal. The digital predistortion model includes a digital predistortion factor $K(n-\tau_m^C)$, where n is a discrete time, $\tau_m^C$ is a memory depth, and a nonlinear distortion characteristic of the digital predistortion output signal is opposite to a nonlinear distortion characteristic of the previous fourth signal. Correspondingly, the method further includes performing slow envelope processing on the fifth signal, and separating the fifth signal on which the slow envelope processing has been performed into two channels of signals; amplifying the two channels of signals; and combining the two channels of amplified signals, to output a sixth signal.

In a possible implementation, the step of obtaining a phase value θ(n) based on the envelope value E(n) may include obtaining θ(n) based on the envelope value E(n) by using a formula $$\theta(n) = \left(1 - \frac{E(n)}{\max(E(n))}\right) \cdot \varphi_0,$$

where $\varphi_0$ is a preset value.

In a possible implementation, the step of obtaining a phase value θ(n) based on the envelope value E(n) includes, when the envelope value E(n) is less than a preset threshold, θ(n) is a specified value.

In a possible implementation, the step of amplifying the second signal and the third signal includes performing impedance matching on the second signal and the third signal separately. A first impedance value after the impedance matching is close to an impedance value corresponding to a maximum power output value of an amplifier power tube, and a second impedance value after the impedance matching is close to an impedance value corresponding to a maximum efficiency output value of the amplifier power tube. The first impedance value is an impedance value corresponding to a first intersection point between an impedance value curve of the second signal and an impedance value curve of the third signal, and the second impedance value is an impedance value corresponding to a second intersection point between the impedance value curve of the second signal and the impedance value curve of the third signal.

According to a third aspect, an embodiment of this application provides a signal processing apparatus, configured to perform the method in the second aspect or any possible implementation of the second aspect. Further, the signal processing apparatus includes modules configured to perform the method in the second aspect or any possible implementation of the second aspect.

According to a fourth aspect, an embodiment of this application provides a chip, where the chip includes a processor and transceiver pins. The transceiver pins and the processor communicate with each other through an internal connection path. The processor performs the method in the second aspect or any possible implementation of the second aspect, to control a receive pin to receive a signal, and control a transmit pin to send a signal.

According to a fifth aspect, an embodiment of this application provides a computer-readable medium, configured to store a computer program, where the computer program includes instructions used to perform the method in the second aspect or any possible implementation of the second aspect.

According to a sixth aspect, an embodiment of this application provides a computer program, where the computer program includes instructions used to perform the method in the second aspect or any possible implementation of the second aspect.

BRIEF DESCRIPTION OF DRAWINGS

To describe the technical solutions in some embodiments of this application more clearly, the following briefly describes the accompanying drawings for describing some of the embodiments of this application. The accompanying drawings in the following description show merely some embodiments of this application, and a person of ordinary skill in the art may derive other drawings from these accompanying drawings without creative efforts.

DESCRIPTION OF EMBODIMENTS

Figure 1:
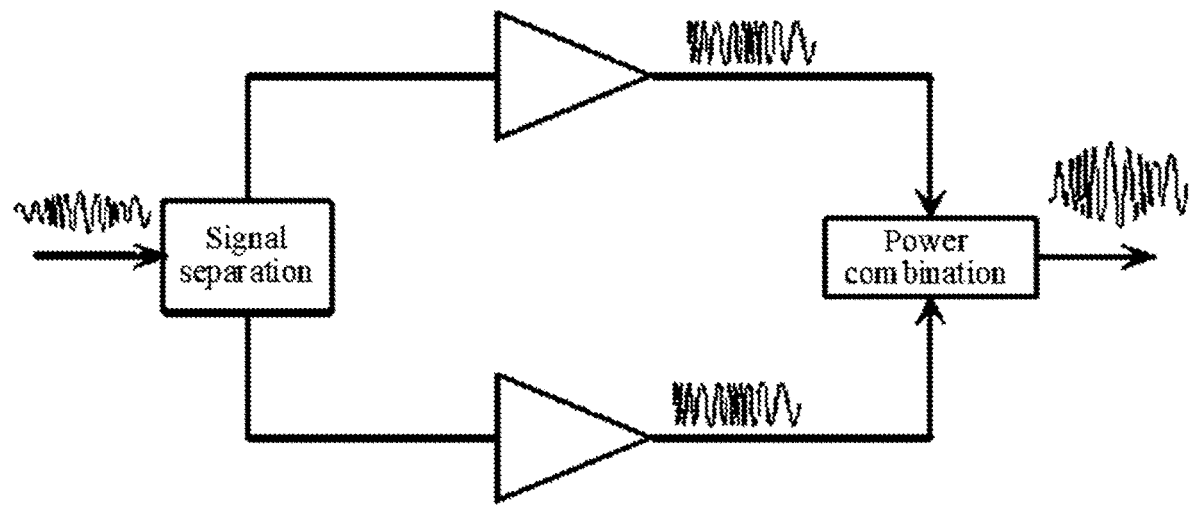
FIG. 1 is an example of a flowchart of an outphasing technology.

The following clearly and describes the technical solutions in embodiments of this application with reference to the accompanying drawings in the embodiments of this application. Clearly, the described embodiments are some but not all of the embodiments of this application. All other embodiments obtained by a person of ordinary skill in the art based on the embodiments of this application without creative efforts shall fall within the protection scope of this application.

The term "and/or" describes merely an association relationship between associated objects and represents that three relationships may exist. For example, A and/or B may represent the following three cases: only A exists, both A and B exist, and only B exists.

In the specification and claims in the embodiments of this application, the terms "first", "second", and the like are intended to distinguish between different objects but do not indicate a particular order of the objects. For example, a first target object, a second target object, and the like, are used to distinguish different target objects, but are not used to describe the specific order of the target objects.

In the embodiments of this application, the word "example", "for example", or the like is used to represent giving an example, an illustration, or a description. Any embodiment or design scheme described as an "example" or with "for example" in the embodiments of this application should not be explained as being more preferred or having more advantages than another embodiment or design scheme. Exactly, use of the word "example", "for example", or the like is intended to present a relative concept in a specific manner.

In the descriptions of the embodiments of this application, unless otherwise stated, the term "a plurality of" refers to two or more than two. For example, a plurality of processing units refer to two or more processing units; and a plurality of systems refer to two or more systems.

To better understand the objective of this application, the following describes the other approaches and existing problems in detail.

As wireless technologies are updated, a data transmission capability is increased from 54 megabits per second (Mbps) limited in 802.11a to 1 gigabits per second (Gbps) limited in 802.11ax, and a signal bandwidth also correspondingly changes from 20 MHz to 160 MHz. A band of the 5G currently being put into commercial use has a maximum signal bandwidth of 100 MHz, which is five times higher than 4th generation mobile communication system (4G) Long-Term Evolution (LTE). In order to satisfy the increasing user data requirements, the continuous expansion of the signal bandwidth is the most effective means.

However, as the signal bandwidth continuously increases, the following problem occurs. A channel capacity is limited, and a high-order QAM technology and an OFDM technology are usually used to increase spectrum utilization. As a result, a larger PAR of a signal is caused. Therefore, the signal in the current communications system has characteristics of a high bandwidth and a high PAR. To enable lossless transmission of the signal, a functional module in a communications link correspondingly needs to satisfy the requirements of a high bandwidth and a high linearity. A PA is one of core function modules in the communications link. When a current signal bandwidth is expanded, the PA needs to have a higher linearity, and the corresponding price is that the PA backs off to a lower-efficiency region. Consequently, the system energy loss is increased, the temperature rises, and a more complex heat dissipation system needs to be added.

Therefore, how to design an efficient PA to satisfy transmission of a signal with a high bandwidth and a high PAR becomes an urgent problem to be resolved. An outphasing technology is one of the effective technical means to resolve the problem.

The following briefly describes the existing outphasing technology.

When an input signal is a signal that includes both amplitude modulation and phase modulation, the signal is separated into two channels of constant envelope phase modulation signals. Amplitude information of the original input signal is contained in phase information of the two channels of separated signals.

The two channels of constant envelope signals are amplified by using two PAs. Because the amplitude of the signal is constant, an efficient PA with nonlinear power may be used to amplify the signal without distortion, so that the linearity of the signal is ensured and the efficient PA is used.

Finally, the two channels of amplified phase modulation signals are combined to restore the original amplitude and phase modulation signal.

The obtaining of the original signal is affected by a phase difference between the two channels of signals. Because phases of the two channels of signals are different, the combination is outphasing combination, namely, outphasing combination. Therefore, loads of the two PAs are dynamic loads affected by the signal phases.

It may be learned from the above description that the core of the concept of outphasing amplification is to convert an amplitude and phase modulation signal into two channels of constant envelope signals, amplify the signals by using an efficient nonlinear PA, and restore the original signal by combining the two channels of signals. The process is shown in FIG. 1.

The method includes separating the input signal $S_{in}(t)$ into two channels of signals $S_1(t)$ and $S_2(t)$. Further, $$S_{in}(t)=A(t)\times\cos(\omega t+\varphi(t)).$$

$A(t)$ is an amplitude modulation signal, $\varphi(t)$ is a phase modulation signal, and $\omega$ is a carrier frequency.

The two channels of separated signals $S_1(t)$ and $S_2(t)$ are represented as:

$$S_1(t)=A_0\times\cos(\omega t+\varphi(t)+\theta(t)), \text{ and}$$

$$S_2(t)=A_0\times\cos(\omega t+\varphi(t)-\theta(t)).$$

$A_0=\max(\text{abs}(A(t)))$, $\theta(t)=\arccos(0.5\times A(t)/A_0)$, and it may be learned from the foregoing formulas that a phase difference between the two signals $S_1(t)$ and $S_2(t)$ is $2\theta(t)$.

Then, $S_1(t)$ and $S_2(t)$ are amplified by two PAs, and then combined by a synthesizer to output a signal $S_{out}(t)$. Further, $$S_{out}(t)=G_{PA}\times[S_1(t)+S_2(t)]=G_{PA}\times A(t)\times\cos(\omega t+\varphi(t)).$$

$G_{PA}$ is a gain value of the PA.

Figure 2A:
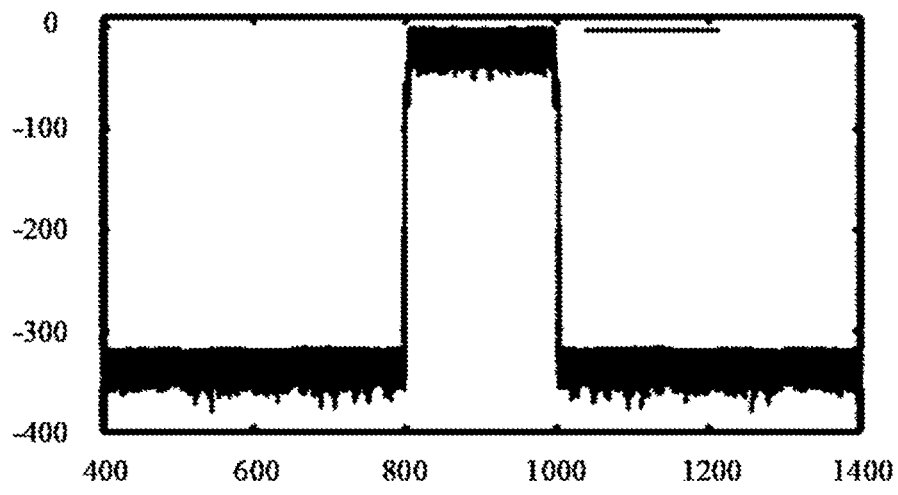
FIG. 2A is an example of a spectrum diagram of a 200 MHz community antenna television (CATV) signal.
Figure 2B:
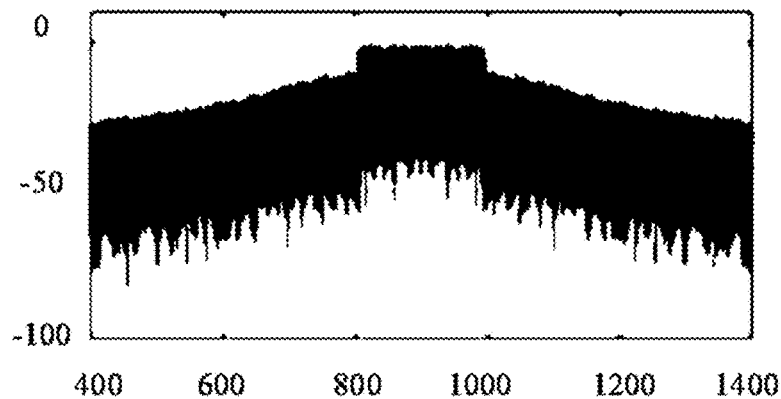
FIG. 2B is an example of a spectrum diagram of a 200 MHz CATV signal on which outphasing processing has been performed.

It may be learned from the foregoing derivation process that, in the conventional outphasing technology, an amplitude and phase modulation signal may be amplified. To be specific, an amplitude is completely converted into a phase. However, when the conventional outphasing technology is applied to a large-bandwidth signal, for example, a signal with a bandwidth of 200 MHz, an experimental result is shown in FIG. 2A and FIG. 2B. FIG. 2A shows a spectrum diagram of a 200 MHz CATV signal, namely, a spectrum diagram of an original signal, where a carrier frequency range of the signal is 800 to 1000 MHz, a horizontal axis is a signal frequency (MHz), and a vertical axis is a power spectral density (dB/Hz). FIG. 2B shows a spectrum diagram of one channel of signal obtained after converting a 200 MHz CATV signal under conventional outphasing processing and obtained through separation by an outphasing system (a horizontal axis is a signal frequency (MHz), and a vertical axis is a power spectral density (decibel (dB)/hertz (Hz)). It may be learned from the figure that, after the 200 MHz signal is processed, a bandwidth expansion effect exists, and the expansion multiple is more than 10 times. To be specific, after the original signal with a bandwidth of 200 MHz is separated, the bandwidth of the two channels of signals may reach at least 2000 MHz. Therefore, the response to the bandwidth requirement of the PA is increased by more than 10 times, which increases the design difficulty of the PA. In addition, when the bandwidth requirement is increased, the PA sacrifices some gains and efficiency, which reduces the overall performance of the system.

Different from the conventional outphasing technology, a hybrid-mode outphasing solution is provided in the other approaches. Further, in a process of converting an amplitude $A(t)$ in an amplitude and phase modulation signal into a phase $\theta(t)$, a segmentation form is used. To be specific, when the output power is high, the value of $\theta(t)$ is still $\arccos(0.5\times A(t)/A_0)$, and when the output power is low, $\theta(t)$ may be a specified value $\theta_{th}(t)$. In other words, amplitudes of some signals (high-power signals) in amplitude and phase modulation signals are converted into phases, and phase values of the other signals (low-power signals) are $\theta_{th}(t)$. In this way, the overall bandwidth expansion effect of the signals is reduced to three to five times.

However, even if the bandwidth expansion effect has been reduced to three to five times, in a large-bandwidth scenario, for example, 5G, namely, 200 MHz, the signal bandwidth is still expanded to at least 600 MHz under the impact of the bandwidth expansion effect, and the bandwidth requirement on the PA is still excessively high, which reduces gains and benefits of the PA. When the hybrid-mode outphasing is used in the large-bandwidth scenario, the overall gains and efficiency of the system still cannot be ensured.

For the foregoing problem in the other approaches, this application provides a signal processing method and system, to effectively reduce the bandwidth expansion, thereby improving the overall performance of the system.

Figure 3:
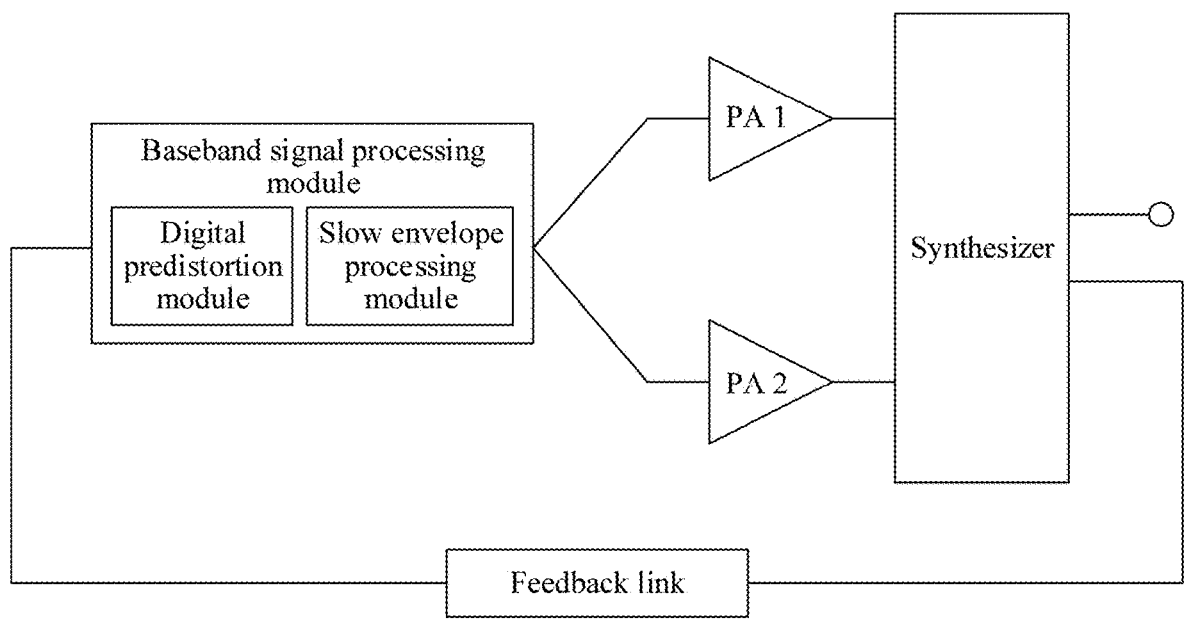
FIG. 3 is a schematic structural diagram of a signal processing system according to an embodiment of this application.

FIG. 3 is a schematic structural diagram of a signal processing system according to an embodiment of this application.

In this embodiment of this application, the signal processing system includes, but is not limited to, a baseband signal processing module and at least one PA. In this embodiment of this application, only PA 1 and PA 2 shown in the figure are used as examples for detailed description. The system further includes a synthesizer and a feedback link.

In an embodiment, modules such as a digital-to-analog conversion module, a filter, an up mixer, and a drive amplifier (not shown in the figure) may be further included between the baseband signal processing module and PA 1 and between the baseband signal processing module and PA 2.

Further, in this embodiment of this application, the baseband signal processing module may include a digital predistortion module, configured to perform digital predistortion processing on an input signal (namely, a first signal in this embodiment of this application) based on an output signal (namely, a fourth signal in this embodiment of this application) output by the synthesizer; and a slow envelope processing module, configured to perform slow envelope processing on the input signal on which the predistortion processing has been performed, and separate the input signal into two channels of sub-signals. It should be noted that locations of the digital predistortion module and the slow envelope processing module in the figure are merely examples. In other words, the digital predistortion module may be located before the slow envelope processing module, or may be located after the slow envelope processing module. This is not limited in this application. The following separately describes the foregoing two processing processes in detail.

Slow Envelope Processing:

Further, in this embodiment of this application, the baseband signal processing module receives an input signal, where the input signal has the following complex number form:

$$x(n)=x_I(n)+j \times x_Q(n).$$

$x_I(n)$ is an I-channel baseband signal, and $x_Q(n)$ is a Q-channel baseband signal.

The slow envelope processing is performed on the input signal. In an embodiment, the slow envelope process may be filtering an original envelope signal corresponding to the input signal by using a low-pass filter, and subtracting the filtered signal from the original envelope signal to obtain a margin signal. Next, shaping filtering is performed on the margin signal, and then the margin signal is added to an output signal of the low-pass filter, to obtain a slow envelope signal. Slow envelope signals with different precision requirements may be implemented by iterating the foregoing processes. It should be noted that the slow envelope process is merely an example, and results obtained after different slow envelope processing processes are different. A specific difference lies in different change ranges of envelope values of signals obtained after different slow envelope processing, and a person skilled in the art may perform slow envelope processing on the input signal by using a corresponding slow envelope processing manner according to an actual requirement. This is not limited in this application.

In this embodiment of this application, there are a plurality of slow envelope processing manners. Therefore, a T { } function is used to represent a slow envelope processing process. In other words, the slow envelope value E(n) may be represented as:

$$E(n)=T\{|x(n)|\},$$

where |x(n)| represents an envelope signal corresponding to an input signal x(n), and may also be understood as an envelope value.

Then, E(n) is converted into a phase value θ(n), which is:

$$\theta(n) = f(E(n)) = \left(1 - \frac{E(n)}{\max(E(n))}\right) \cdot \varphi_0.$$

$\varphi_0$ is a constant, namely, a specified value, and is used to limit a maximum value of θ(n). A person skilled in the art may set $\varphi_0$ according to an actual requirement. This is not limited in this application.

It should be noted that, the foregoing formula for representing θ(n) by using E(n) is used to enable E(n) and θ(n) in a linear relationship or approximately linear relationship. Therefore, in another embodiment, θ(n) may alternatively be obtained by using another formula. For example:

$$\theta(n) = f(E(n)) = \left(E(n) - a \cdot \frac{E(n)}{\max(E(n))}\right) \cdot \varphi_0,$$

where a is a constant, and is also used to limit the value of θ(n).

In this embodiment of this application, a person skilled in the art may use the following formula:

$$\theta(n)=f(E(n))=(-a \cdot E(n)+b) \cdot \varphi_0,$$

where (where both a and b are constants, and are also used to limit the value of θ(n)) a representation formula between E(n) and θ(n) is transformed, and the result is that E(n) and θ(n) are in a linear relationship or an approximate linear relationship. Therefore, in this embodiment of this application, specific expression forms of E(n) and θ(n) are not limited.

In this embodiment of this application, for a signal when the input signal is in low power (the input signal is an overall signal having a high-power part and a low-power part, and is referred to as a low-power part below), to ensure maximum efficiency, after the baseband signal processing module performs slow envelope processing on the low-power part, due to a limitation of the slow envelope technology, for the low-power part, the slow envelope processing does not change an envelope value range of the low-power part. In other words, an envelope value corresponding to the low-power part obtained after the slow envelope processing is performed is the same as an envelope value obtained before the slow envelope processing is performed. Therefore, in this embodiment of this application, to reduce the impact of the low-power part on the bandwidth expansion of the overall signal, the value of θ(n) may be set to a constant value, where the constant value may be a maximum value max(θ(n)) of θ(n), for example, 60°, to further improve the overall performance of the system.

In addition, in this embodiment of this application, a threshold may be set to define the low-power part and the high-power part. Further, when E(n) is less than the threshold, it may be determined that the current power of the input signal is low power, namely, the input signal is a low-power part. On the contrary, when E(n) is greater than or equal to the threshold, it may be determined that the current power of the input signal is high power, namely, the input signal is a high-power part. It should be noted that a value of the envelope value E(n) may be used to describe a power value of a current input signal. In other words, a larger E(n) indicates a higher signal power.

For the low-power part of the input signal, θ(n) is a constant value, namely, max(θ(n)). To be specific, two signals $x_1(n)$ (namely, a second signal in this embodiment of this application) and $x_2(n)$ (namely, a third signal in this embodiment of this application) obtained after the input signal is separated may be represented as:

$$x_1(n) = \beta \cdot |x(n)| \cdot e^{j(\varphi_x(n) + max(\theta(n)))}, \text{ and}$$

$$x_2(n) = \beta \cdot |x(n)| \cdot e^{j(\varphi_x(n) - max(\theta(n)))}.$$

$\beta$ is a power factor with a value interval of (0, 1), and it may be learned from the foregoing formulas that a phase difference between the two channels of separated signals is $2 \max(\theta(n))$. It should be noted that due to elements such as an error in signal processing, in an actual processing process, a phase difference between the two channels of separated signals is close to $2 \max(\theta(n))$, namely, fluctuates within an effective range of $2 \max(\theta(n))$.

For the high-power part of the input signal, $\theta(n)$ may be represented by E(n). The two channels of separated signals are separately as follows:

$$x_1(n) = \beta \cdot |x(n)| \cdot e^{j(\varphi_x(n) + max(\theta(n)))}, \text{ and}$$

$$x_2(n) = \beta \cdot |x(n)| \cdot e^{j(\varphi_x(n) - max(\theta(n)))}.$$

$\varphi_x(n)$ is a phase value of an input signal x(n), $\beta$ is a power factor with a value interval of (0, 1). Similarly, a phase difference between the two channels of signals is $2 \theta(n)$, or fluctuates within an effective range of $2 \theta(n)$.

Figure 4:
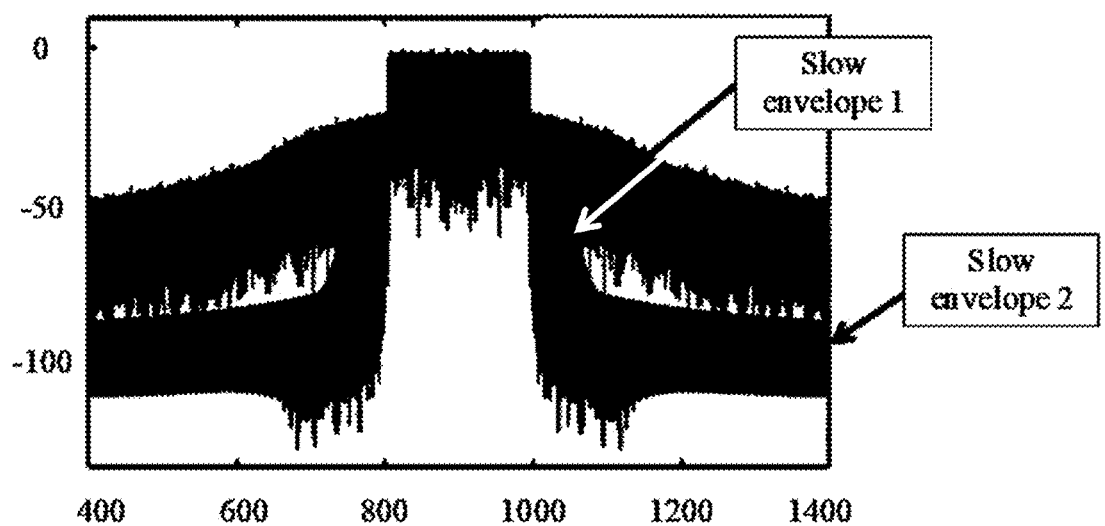
FIG. 4 is a comparison diagram before and after slow envelope processing according to an embodiment of this application.

FIG. 4 is a comparison diagram before and after slow envelope processing according to an embodiment of this application. A light gray part is a spectrum diagram of one signal obtained after conventional outphasing processing (for details, refer to FIG. 2B and related parameters thereof), and a dark gray part and a black part are respectively spectrum diagrams of one channel of signal processed in a slow envelope processing manner 1 and one channel of signal processed in a slow envelope processing manner 2. It may be learned from the figure that the bandwidth of the signal processed in the slow envelope processing manner 1 and the bandwidth of the signal processed in the slow envelope processing manner 2 are significantly reduced, and the bandwidth of the signal processed in the slow envelope processing manner 2 is better than the bandwidth of the signal processed in the slow envelope processing manner 1. Therefore, a person skilled in the art may select a slow envelope processing manner based on an actual measurement result and an actual requirement. This is not limited in this application.

Digital Predistortion Processing:

Further, in this embodiment of this application, because processing such as filtering is performed on a signal obtained after slow envelope processing, some useful signals may be missing, causing incomplete signals, which affects the signal quality and reduces the linearity of the system. Therefore, a digital predistortion processing process based on slow envelope processing is introduced to this embodiment of this application, to compensate the signals, thereby improving the linearity of the system.

Further, in this embodiment of this application, the feedback link retrieves an output signal of the synthesizer to the baseband signal processing module, to serve as a reference signal for digital predistortion processing. The feedback link includes, but is not limited to, modules such as a coupler, an attenuator, and a high-speed analog-to-digital converter. Components configured to perform digital predistortion in the baseband signal processing module may include modules such as a predistorter and a predistortion trainer. The predistortion trainer converts a signal (the output signal output by the synthesizer, namely, the fourth signal in this embodiment of this application) collected by the feedback link into a digital predistortion coefficient required by the predistorter, and substitutes the obtained digital predistortion coefficient into a digital predistortion model, to obtain a digital predistortion output signal.

Further, the baseband signal processing module uses a slow envelope-based Generalized Memory Polynomial (GMP) to represent the digital predistortion model of the PA. An expression of the GMP is as follows:

$$\hat{y}(n) = \Sigma_{l=0}^{LA} \Sigma_{p=0}^{PA} a_{pl} \cdot x(n-\tau_l^A) \cdot |x(n-\tau_l^A)|^p + \Sigma_{l=0}^{LB} \Sigma_{m=0}^{MB} \Sigma_{p=0}^{PB} b_{pml} \cdot x(n-\tau_l^B).$$

$$|x(n-\tau_l^B - \tau_m^B)|^p + \Sigma_{l=0}^{LC} \Sigma_{m=0}^{MC} \Sigma_{r=0}^{PC} \Sigma_{p=0}^{PB} c_{prml} \cdot x(n) |x(n-\tau_l^C)|^p \cdot (K(n-\tau_m^C))^r,$$

where $K(n-\tau_m^C)$ is a digital predistortion factor, n is a discrete time, $\tau_m^C$ is a memory depth, $\hat{y}[n]$ is the digital predistortion output signal, and $a_{pl}$, $b_{pml}$, and $c_{prml}$ are coefficients required by the foregoing predistortion. To be specific, the obtained digital predistortion coefficient may be substituted into the digital predistortion model, to obtain a predistortion output signal.

A nonlinear distortion characteristic of the digital predistortion output signal output by the predistorter is opposite to a nonlinear distortion characteristic of an output signal of the outphasing system. In other words, the nonlinear distortion of the output signal of the system may be compensated by using the nonlinear distortion of the digital predistortion output signal, thereby implementing one linear output signal.

Then, the system performs processing such as slow envelope processing, and signal separation, amplification, and combination on the signal on which digital predistortion processing has been performed (namely, a fifth signal in this embodiment of this application), and iterates the foregoing steps, to further improve the linearity of the output signal.

In conclusion, in this embodiment of this application, the baseband signal processing module performs slow envelope processing on the input signal, and obtains $\theta(n)$ based on the envelope value E(n), so that $\theta(n)$ and E(n) are in a linear relationship, thereby effectively reducing the bandwidth expansion effect, keeping system gains constant, and effectively improving efficiency and overall performance of the system, so that the system may be used in not only a small-bandwidth application scenario, but also a large-bandwidth (for example, 5G) application scenario.

Figure 5:
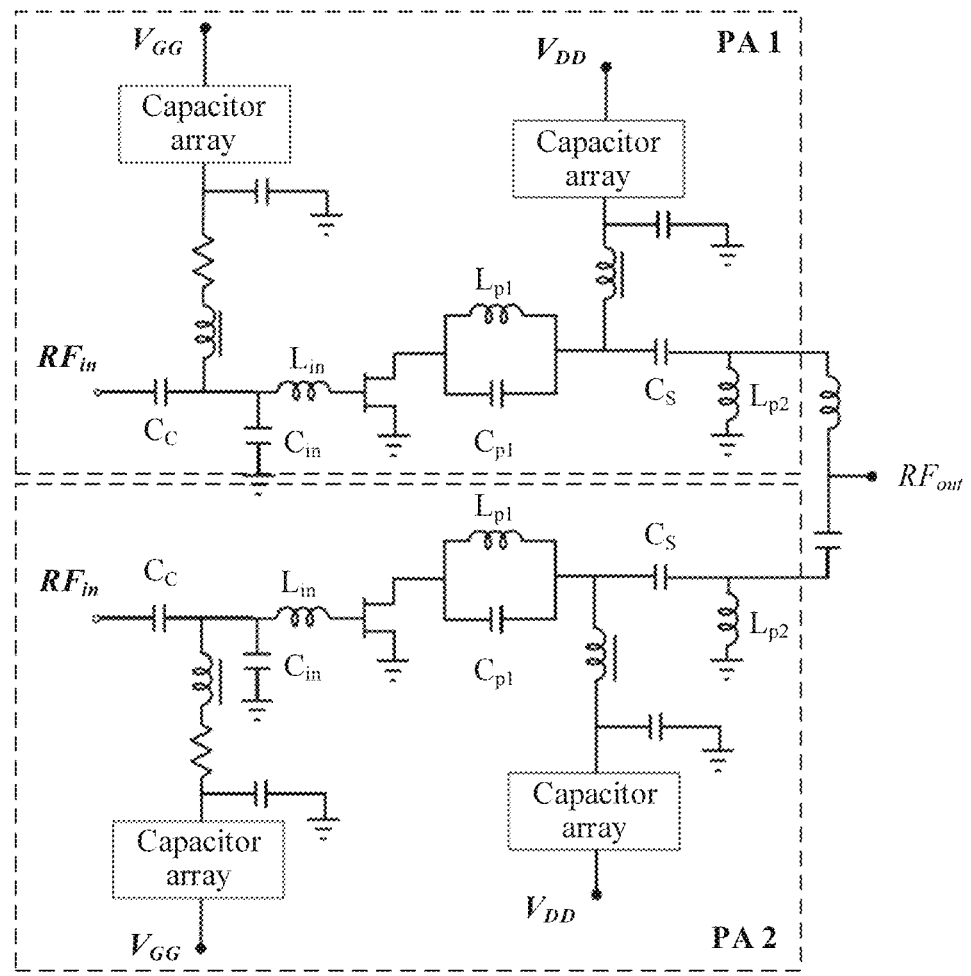
FIG. 5 is a circuit diagram of an amplifier and a synthesizer according to an embodiment of this application.

In this embodiment of this application, a circuit diagram of the PA and the synthesizer is shown in FIG. 5. In this embodiment of this application, the synthesizer may be a Chireix synthesizer with low isolation, and includes an inductor $L_{cmb}$ and a capacitor $C_{cmb}$. In another embodiment, the synthesizer may alternatively be another synthesizer with low isolation. This is not limited in this application.

Further, the PA includes, but is not limited to, four parts: an input matching network, a power amplifier tube, an output matching network, and a bias network. Referring to FIG. 5, the input matching network may include $C_c$, $C_{in}$, and $L_{in}$, and the output matching network includes $C_{p1}$, $L_{p1}$, $C_s$, and $L_{p2}$. The power amplifier tube is an active amplifier component and generally includes three ports: input ($RF_{in}$), output ($RF_{out}$), and ground.

Figure 6:
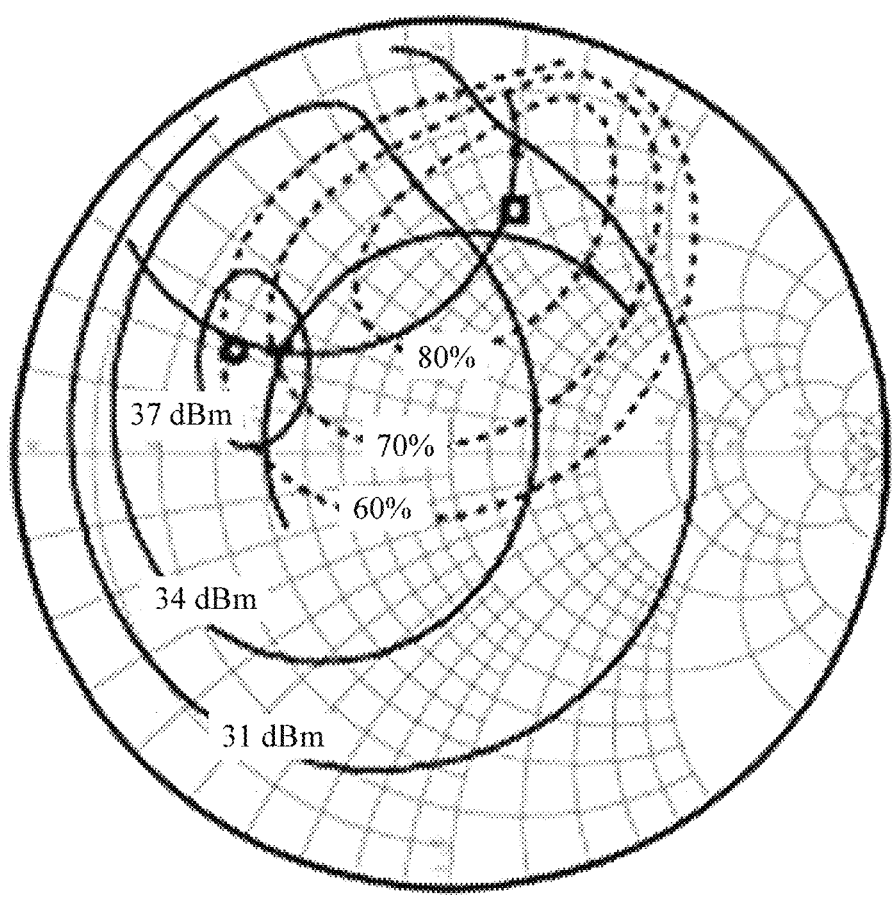
FIG. 6 is a diagram of an impedance change trend of an active load modulation effect according to an embodiment of this application.
Figure 7:
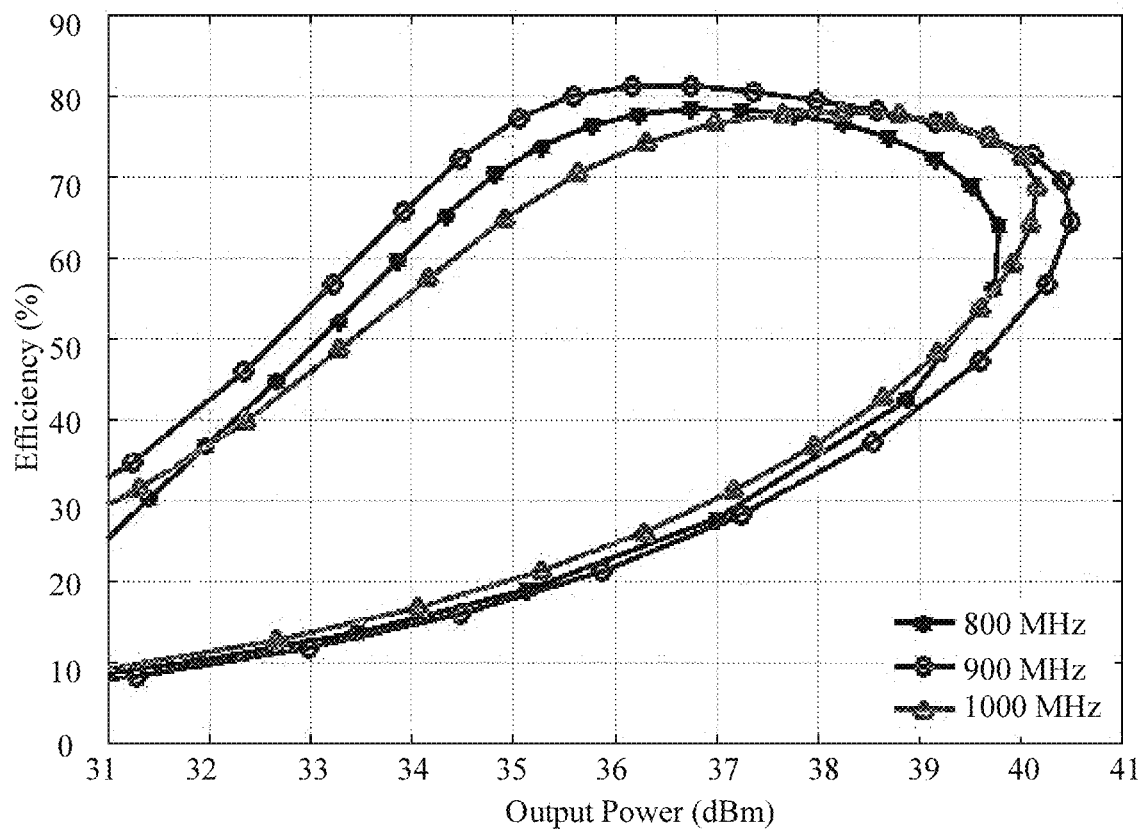
FIG. 7 is a diagram of an efficiency simulation result within a frequency range of 800 MHz to 1000 MHz according to an embodiment of this application.

In the design of the PA, a proper power amplifier tube is generally selected first according to an actual output power requirement. In this embodiment of this application, Cree CGH40006P is selected as the power amplifier tube. FIG. 6 shows a diagram of an impedance change trend of an active load modulation effect, and shows changes of two channels of impedances with the change of the phase after the output matching network is transformed. Further, referring to FIG. 6, a solid line is a contour corresponding to a power impedance of the PA power amplifier tube, and a dashed line is a contour corresponding to an efficiency impedance value of the PA power amplifier tube. An impedance value corresponding to a maximum efficiency output value of the PA power amplifier tube (a black spot in the contour center of the efficiency impedance value in the figure) and an impedance value corresponding to a maximum power output value (a black spot corresponding to the power impedance value in the figure) may be found in the figure. In this embodiment of this application, values of the inductor L and the capacitor C in the output matching circuit may be adjusted based on the impedance value corresponding to the maximum efficiency output value and the impedance value corresponding to the maximum power output value, to transfer impedance values (two curves in FIG. 6) of the two channels of signals, and make a first intersection point of the impedance value curves of the two channels of signals be close to the impedance value corresponding to the maximum power output value, and a second intersection point be close to the impedance value corresponding to the maximum efficiency output value, so that an efficiency simulation result of the output signal of the system is shown in FIG. 7. The following describes FIG. 7 in detail.

Further, FIG. 7 is a diagram of an efficiency simulation result within a frequency range of 800 MHz to 1000 MHz (800 MHz, 900 MHz, and 1000 MHz are used as examples in the figure for description, where a horizontal axis in FIG. 7 is an output power (in decibel-milliwatts (dBm)), and a vertical axis is an output efficiency). It may be learned from the figure that, within the frequency range from 800 MHz to 1000 MHz, an efficiency value at a 6 dB backoff position (for example, in FIG. 7, the maximum power is 40 dBm, and the PA usually works in a backoff region. In this embodiment of this application, the backoff region is 6 dB, namely, at a 34 dBm position) is basically consistent with an efficiency value corresponding to the maximum output power (namely, 40 dBm). In other words, after a signal with a bandwidth of 200 MHz is processed by the signal processing system in this embodiment of this application, a sacrificed efficiency value is relatively small. Therefore, it may be learned that the signal processing system in this embodiment of this application may be configured to process a signal with a bandwidth of about 200 MHz (and it should be noted that 200 MHz is an approximate bandwidth, and may fluctuate within a small range of 200 MHz. This is not limited in this application).

Figure 8:
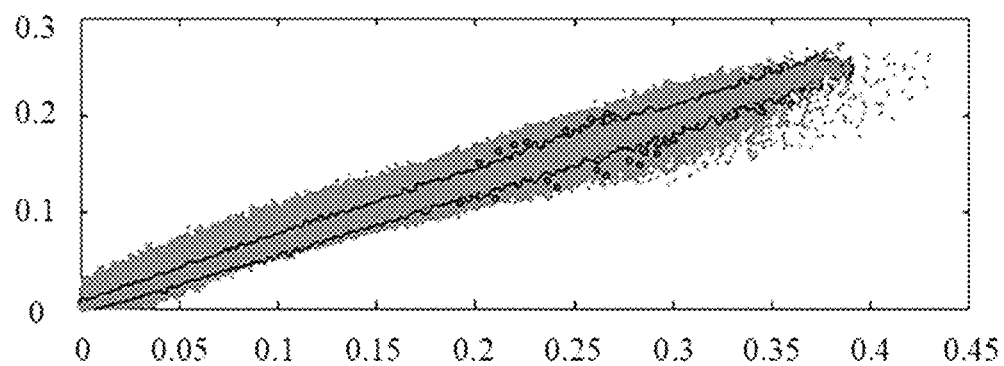
FIG. 8 is an amplitude-amplitude (AM-AM) curve before and after digital predistortion processing according to an embodiment of this application.
Figure 9:
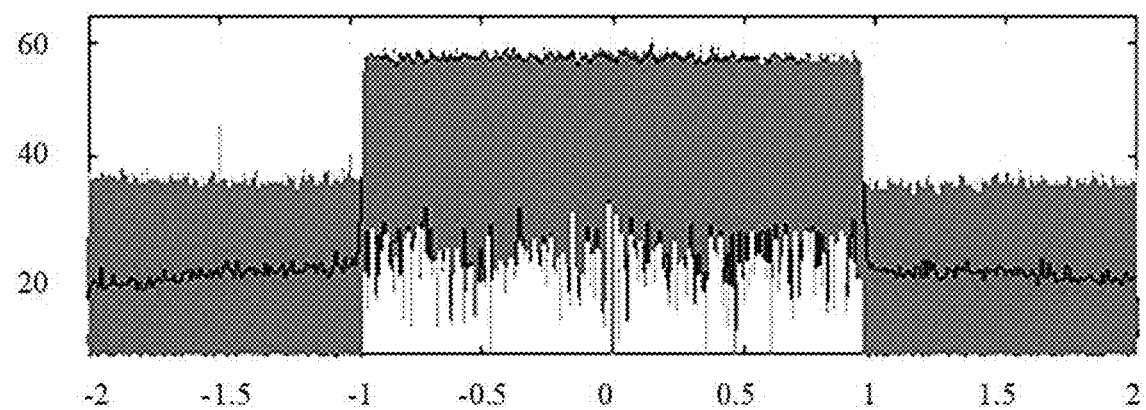
FIG. 9 is a spectrum diagram before and after digital predistortion processing according to an embodiment of this application.
Figure 10A:
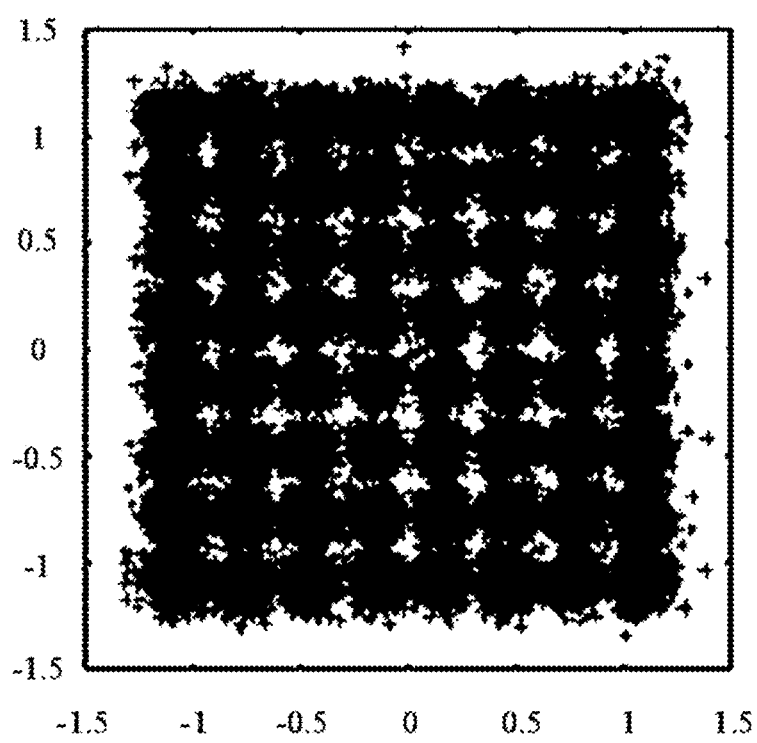
FIG. 10A is a constellation diagram before digital predistortion processing according to an embodiment of this application.
Figure 10B:
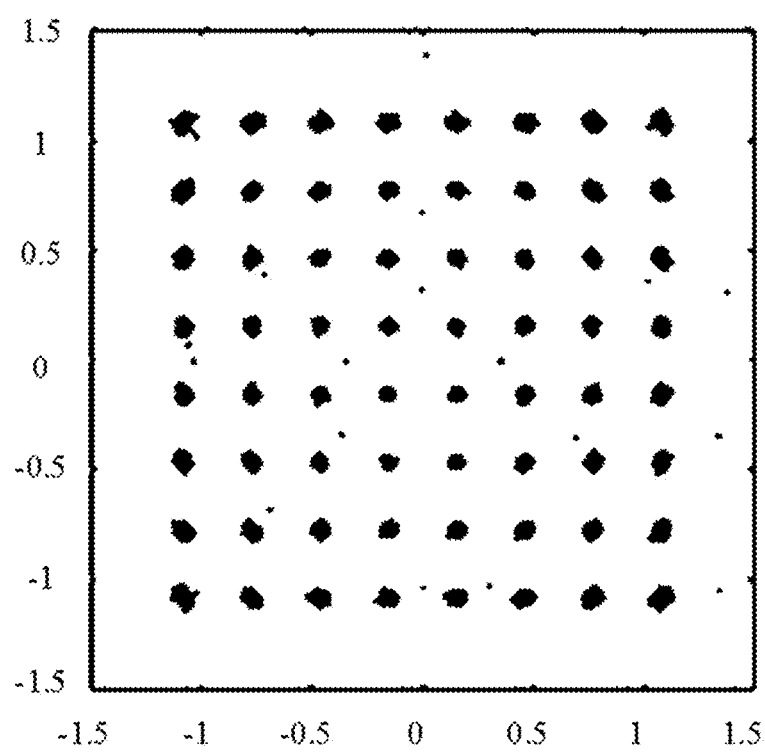
FIG. 10B is a constellation diagram after digital predistortion processing according to an embodiment of this application.

Results obtained after measurement is performed based on the signal processing system in this embodiment of this application are shown in FIG. 8 to FIG. 10. A modulation signal excitation used in the measurement process is a single-channel CATV signal (namely, an input signal in this embodiment of this application). Detailed parameters are as follows. A carrier frequency is 900 MHz, a signal bandwidth is 200 MHz, a 64QAM modulation signal, and a peak to average power ratio (PAPR) is 12.3 dB. After the signal processing system in this embodiment of this application performs processing, a measurement result is as follows. An output power may reach 26.3 dBm, an adjacent channel power ratio (ACPR) is less than −40 dBc, an error vector magnitude (EVM) is less than −42 dB, and a frequency efficiency reaches 18.8%. FIG. 8 shows an AM-AM curve of an output signal on which digital predistortion processing has been performed (where a horizontal axis is a normalized input signal amplitude, and a vertical axis is a normalized output signal amplitude). The AM-AM curve on which digital predistortion processing has been performed (a part surrounded by a black solid line in the figure) is significantly thinner than an AM-AM curve (a gray part in the figure) on which digital predistortion processing has not been performed. In other words, the memory effect compensation effect is obvious. FIG. 9 is a spectrum diagram of an output signal on which digital predistortion processing has been performed and an output signal on which digital predistortion processing has not been performed (a horizontal axis is a signal frequency ($10^8$ MHz), and a vertical axis is a power spectral density (dB/Hz)). In-band/out-of-band distortion after digital signal processing is performed (a part surrounded by a black solid line in the figure) is significantly lower than in-band/out-of-band distortion (a gray part in the figure) before digital predistortion processing. In other words, the distortion compensation effect is obvious. FIG. 10A shows a constellation diagram of an output signal before digital predistortion processing. It may be learned from the figure that constellation points are diffused. FIG. 10B shows a constellation diagram of an output signal after digital predistortion processing. It may be learned from the figure that constellation point diffusion decreases significantly. The linearity of the output signal on which digital predistortion processing has been performed is higher than that of the output signal on which digital predistortion processing has not been performed.

Based on a same technical concept, an embodiment of this application further provides a signal processing apparatus, configured to perform the foregoing method embodiment.

Based on a same technical concept, an embodiment of this application further provides a chip, where the chip includes a processor and transceiver pins. The transceiver pins and the processor communicate with each other through an internal connection path. The processor is configured to perform the foregoing method embodiment, to control a receive pin to receive a signal, and control a transmit pin to send a signal.

Based on a same technical concept, an embodiment of this application further provides a computer-readable medium, configured to store a computer program, where the computer program includes instructions used to perform the foregoing method embodiment.

Based on a same technical concept, an embodiment of this application further provides a computer program, where the computer program includes instructions used to perform the foregoing method embodiment.

The foregoing describes the embodiments of this application with reference to the accompanying drawings. However, this application is not limited to the foregoing specific implementations. The foregoing specific implementations are merely examples, and are not limitative. Inspired by this application, a person of ordinary skill in the art may further make many modifications without departing from the purposes of this application and the protection scope of the claims, and all the modifications shall fall within the protection scope of this application.

What is claimed is:
1. A system comprising:
 a baseband signal processer configured to:
  perform an envelope processing on a first signal to obtain an envelope value E(n) of the first signal, wherein n is a discrete time;
  generate a phase value (θ(n)) from the envelope value E(n), wherein θ(n) and E(n) are in a linear relationship, and wherein the phase value θ(n) is varying in time according to E(n); and separate the first signal into a second signal and a third signal based on θ(n), wherein a phase difference between the second signal and the third signal is 2 θ(n), and wherein the phase difference between the second signal and the third signal is varying in time according to θ(n);

an amplifier coupled to the baseband signal processor and configured to:
  amplify the second signal to obtain an amplified second signal; and
  amplify the third signal to obtain an amplified third signal; and a synthesizer coupled to the amplifier and configured to combine the amplified second signal and the amplified third signal to obtain a fourth signal.

2. The system of claim 1, wherein the baseband signal processor is further configured to:
  obtain a digital predistortion coefficient based on a previous fourth signal;
  substitute the digital predistortion coefficient into a digital predistortion model to obtain a digital predistortion output signal;
  perform a digital predistortion processing on a fifth signal based on the digital predistortion output signal, wherein the digital predistortion model comprises a digital predistortion factor $(K(n-\tau_m^C))$, wherein $\tau_m^C$ is a memory depth, and wherein a first nonlinear distortion characteristic of the digital predistortion output signal is opposite to a second nonlinear distortion characteristic of the previous fourth signal; and
  perform the envelope processing on the fifth signal; and
  separate the fifth signal on which the envelope processing has been performed into two channels of signals,
  wherein the amplifier is further configured to amplify the two channels of signals to obtain two channels of amplified signals, and
  wherein the synthesizer is further configured to combine the two channels of amplified signals to output a sixth signal.

3. The system of claim 1, wherein the baseband signal processor is further configured to obtain θ(n) based on E(n) using a formula:

$$\theta(n) = \left(1 - \frac{E(n)}{\max(E(n))}\right) \cdot \varphi_0,$$

wherein $\varphi_0$ is a preset value.

4. The system of claim 3, wherein E(n) is less than a preset threshold, and wherein θ(n) is a constant value.

5. The system of claim 1, wherein the amplifier comprises an output matching circuit configured to perform an impedance matching separately on the second signal and the third signal, wherein a first impedance value after the impedance matching is proximate to a third impedance value corresponding to a maximum power output value of an amplifier power tube, wherein the first impedance value corresponds to a first intersection point between a first impedance value curve of the second signal and a second impedance value curve of the third signal, wherein a second impedance value after the impedance matching is proximate to a fourth impedance value corresponding to a maximum efficiency output value of the amplifier power tube, wherein the second impedance value corresponds to a second intersection point between the first impedance value curve and the second impedance value curve.

6. The system of claim 1, wherein the synthesizer is a Chireix synthesizer having a predetermined low isolation.

7. The system of claim 1, wherein the system is applied to a fifth generation (5G) mobile communication system.

8. A method comprising:
  performing an envelope processing on a first signal to obtain an envelope value E(n) of the first signal, wherein n is a discrete time;
  generating a phase value (θ(n)) from the envelope value E(n), wherein θ(n) and E(n) are in a linear relationship, and wherein the phase value θ(n) is varying in time according to E(n);
  separating the first signal into a second signal and a third signal based on θ(n), wherein a phase difference between the second signal and the third signal is 2 θ(n), and wherein the phase difference between the second signal and the third signal is varying in time according to θ(n);
  amplifying the second signal to obtain an amplified second signal;
  amplifying the third signal to obtain an amplified third signal; and
  combining the amplified second signal and the amplified third signal to obtain a fourth signal.

9. The method of claim 8, wherein before performing the envelope processing on the first signal, the method further comprises:
  obtaining a digital predistortion coefficient based on a previous fourth signal;
  substituting the digital predistortion coefficient into a digital predistortion model to obtain a digital predistortion output signal;
  performing a digital predistortion processing on a fifth signal based on the digital predistortion output signal, wherein the digital predistortion model comprises a digital predistortion factor $(K(n-\tau_m^C))$, wherein $\tau_m^C$ is a memory depth, and wherein a first nonlinear distortion characteristic of the digital predistortion output signal is opposite to a second nonlinear distortion characteristic of the previous fourth signal;
  performing the envelope processing on the fifth signal;
  separating the fifth signal on which the envelope processing has been performed into two channels of signals;
  amplifying the two channels of signals to obtain two channels of amplified signals; and
  combining the two channels of amplified signals to output a sixth signal.

10. The method of claim 8, further comprising obtaining based on E(n) using a formula:

$$\theta(n) = \left(1 - \frac{E(n)}{\max(E(n))}\right) \cdot \varphi_0,$$

wherein $\varphi_0$ is a preset value.

11. The method of claim 10, wherein E(n) is less than a preset threshold, and wherein θ(n) is a constant value.

12. The method of claim 8, further comprising performing an impedance matching separately on the second signal and the third signal, wherein a first impedance value after the impedance matching is proximate to a third impedance value corresponding to a maximum power output value of an amplifier power tube, wherein the first impedance value corresponds to a first intersection point between a first impedance value curve of the second signal and a second impedance value curve of the third signal, wherein a second impedance value after the impedance matching is proximate to a fourth impedance value corresponding to a maximum efficiency output value of the amplifier power tube, and wherein the second impedance value corresponds to a second intersection point between the first impedance value curve and the second impedance value curve.

13. The method of claim 8, further comprising combining, using a Chireix synthesizer, the amplified second signal and the amplified third signal to obtain the fourth signal.

14. The method of claim 8, wherein the method is applied to a fifth generation (5G) mobile communication system.

15. A computer program product comprising computer-executable instructions stored on a non-transitory computer-readable medium that, when executed by a processor, cause an apparatus to:
- perform an envelope processing on a first signal to obtain an envelope value (E(n)) of the first signal, wherein n is a discrete time;
- generate a phase value (θ(n)) from the envelope value E(n), wherein θ(n) and E(n) are in a linear relationship, and wherein the phase value θ(n) is varying in time according to E(n), and wherein the phase difference between the second signal and the third signal is varying in time according to θ(n);
- separate the first signal into a second signal and a third signal based on θ(n), wherein a phase difference between the second signal and the third signal is 2 θ(n));
- amplify the second signal to obtain an amplified second signal;
- amplify the third signal to obtain an amplified third signal; and
- combine the amplified second signal and the amplified third signal to obtain a fourth signal.

16. The computer program product of claim 15, wherein the computer-executable instructions further cause the apparatus to:
- obtain a digital predistortion coefficient based on a previous fourth signal;
- substitute the digital predistortion coefficient into a digital predistortion model to obtain a digital predistortion output signal;
- perform a digital predistortion processing on a fifth signal based on the digital predistortion output signal, wherein the digital predistortion model comprises a digital predistortion factor ($K(n-\tau_m^C)$), wherein $\tau_m^C$ is a memory depth, and wherein a first nonlinear distortion characteristic of the digital predistortion output signal is opposite to a second nonlinear distortion characteristic of the previous fourth signal;
- perform the envelope processing on the fifth signal;
- separate the fifth signal on which the envelope processing has been performed into two channels of signals;
- amplify the two channels of signals to obtain two channels of amplified signals; and
- combine the two channels of amplified signals to output a sixth signal.

17. The computer program product of claim 15, wherein the computer-executable instructions further cause the apparatus to further obtain θ(n) based on E(n) using a formula:

$$\theta(n) = \left(1 - \frac{E(n)}{\max(E(n))}\right) \cdot \varphi_0,$$

wherein $\varphi_0$ is a preset value.

18. The computer program product of claim 17, wherein E(n) is less than a preset threshold, and wherein θ(n) is a specified value.

19. The computer program product of claim 15, wherein the computer-executable instructions further cause the apparatus to perform an impedance matching separately on the second signal and the third signal, wherein a first impedance value after the impedance matching is proximate to a third impedance value corresponding to a maximum power output value of an amplifier power tube, wherein the first impedance value corresponds to a first intersection point between a first impedance value curve of the second signal and a second impedance value curve of the third signal, wherein a second impedance value after the impedance matching is proximate to a fourth impedance value corresponding to a maximum efficiency output value of the amplifier power tube, and wherein the second impedance value corresponds to a second intersection point between the first impedance value curve and the second impedance value curve.

20. The computer program product of claim 15, wherein the computer-executable instructions further cause the apparatus to combine, using a Chireix synthesizer having a determined low isolation, the amplified second signal and the amplified third signal to obtain the fourth signal, and wherein the computer program product is applied to a fifth generation (5G) mobile communication system.

* * * * *